(12) United States Patent
Sawada et al.

(10) Patent No.: US 8,426,816 B2
(45) Date of Patent: Apr. 23, 2013

(54) IMAGING DEVICE, A/D CONVERTER DEVICE AND READING CIRCUIT

(75) Inventors: Akira Sawada, Kawasaki (JP); Hironori Nishino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 323 days.

(21) Appl. No.: 12/963,956

(22) Filed: Dec. 9, 2010

(65) Prior Publication Data
US 2011/0157439 A1 Jun. 30, 2011

(30) Foreign Application Priority Data
Dec. 28, 2009 (JP) .................................. 2009-297447

(51) Int. Cl.
*G01J 5/00* (2006.01)

(52) U.S. Cl.
USPC ....................................................... 250/338.1

(58) Field of Classification Search .... 250/338.1–338.5, 250/340, 370.01–370.15, 362
See application file for complete search history.

(56) References Cited

U.S. PATENT DOCUMENTS
5,945,935 A * 8/1999 Kusumoto et al. ............ 341/159

FOREIGN PATENT DOCUMENTS
| JP | 2000-224440 | | 8/2000 |
| JP | 2008-236158 | A1 | 10/2008 |
| JP | 2008-278284 | A1 | 11/2008 |

* cited by examiner

*Primary Examiner* — Kiho Kim
(74) *Attorney, Agent, or Firm* — Kratz, Quintos & Hanson, LLP

(57) ABSTRACT

An A/D converter device includes a zone identifying circuit configured to identify which one of a plurality of level zones a voltage level of an analog output signal is in; a shift voltage generating circuit configured to generate a shift voltage which corresponds to a relevant one of the level zones; an operational amplifier circuit configured to change the analog output signal by means of the shift voltage, the operational amplifier circuit being configured to amplify the changed analog output signal to suit an A/D conversion input range so as to generate an amplified and shifted analog signal; a first A/D converter circuit configured to A/D-convert the amplified and shifted analog signal so as to calculate a first A/D converted value; and a second A/D converted value calculating circuit configured to calculate a second A/D converted value from the first A/D converted value in accordance with the relevant level zone.

20 Claims, 17 Drawing Sheets

IMAGING DEVICE, A/D CONVERTER DEVICE AND READING CIRCUIT

CROSS-REFERENCE TO RELATED APPLICATION

This application is based upon and claims the benefit of priority of the prior Japanese Patent Application No. 2009-297447, filed on Dec. 28, 2009, the entire contents of which are incorporated herein by reference.

FIELD

The embodiments discussed herein are related to an imaging device, an A/D converter device and a reading circuit.

BACKGROUND

Multiple-element sensors (such as, imaging devices) are widely used. It is desirable for a multiple-element sensor to have a wide dynamic range. It is desirable for an X-ray imaging element or an infrared imaging element, in particular, to have a wide dynamic range.

An infrared imaging device that uses an infrared imaging element is characterized by being able to measure temperature in a non-contact manner, and is widely used in various fields (such as, security, medical care, preservation, R&D and military affairs). The infrared imaging device is used for, e.g., measuring a body temperature of a passenger in a non-contact manner at an airport so as to extract a patient having an infectious disease. Related arts are disclosed in, e.g., Japanese Laid-open Patent Publication Nos. 2008-278284, 2008-236158 and 2000-224440. An exemplary infrared imaging device that uses an infrared imaging element will be explained below, although the art described herein is not limited to the example.

FIG. 1 illustrates an exemplary image system that uses an infrared imaging device. As illustrated in FIG. 1, a lens 3 projects an infrared image emitted by an observed object 4 on an infrared imaging element 2 of an infrared imaging device 1. The projected infrared image is converted into an electric signal by a photosensitive portion of the infrared imaging element 2. The electric signal is multiplexed by a reading circuit provided in the infrared imaging element 2, and then sent to a signal processing circuit 10 provided outside the infrared imaging element 2.

The signal processing circuit 10 includes an, e.g., A/D converter circuit 11, an operational circuit 12, a memory 13 and a D/A converter circuit 14. The A/D converter circuit 11 converts an analog signal provided by the reading circuit into a digital signal. The operational circuit 12 carries out gain and offset correction on the digital signal provided by the A/D converter circuit 11. The operational circuit 12 further corrects a variation of every pixel on the basis of correction data stored in the memory 13 so as to produce a corrected digital signal. The corrected digital signal is a final outcome of the A/D conversion. What is called the A/D conversion process includes the process carried out by the operational circuit 12. The D/A converter circuit 14 converts the corrected digital signal into an analog signal and outputs the analog signal. A display 15 displays the infrared image of the observed object 4 on the basis of the analog signal. The corrected digital signal is stored in an external storage device or the like, as necessary.

FIG. 2 illustrates an exemplary infrared imaging element (chip) 2. As illustrated in FIG. 2, the infrared imaging element 2 includes an infrared sensor (photosensitive portion) 5 formed by, e.g., a compound semiconductor material, and a reading circuit unit 6 formed by silicon (Si) material. Mating electrodes of the infrared sensor 5 and the reading circuit unit 6 are coupled to each other by a bump 7 made of indium (In).

An infrared imaging element should preferably be able to capture infrared images of high precision, high sensitivity and low noise at a high-speed frame rate. Thus, the infrared sensor 5 is made of a compound semiconductor of high sensitivity. It is however difficult to make it significantly uniform at present. Hence, the signal processing circuit 10 is provided outside the sensor chip, so that a sensitivity variation, a dark current variation and a nonlinear relationship between an amount of incident rays and an output current of every element in the chip are corrected. The digital operational circuit 12 can thereby be used for carrying out a correcting operation or the like, after the A/D converter circuit 11 A/D-converts the output of the infrared sensor, so that an infrared image of low noise can be obtained.

FIG. 3 illustrates an exemplary reading circuit unit 6. A reading circuit 20 includes, e.g., a plurality of scan lines SL horizontally extended parallel, a plurality of vertical bus lines BL vertically extended parallel, and a plurality of signal input circuits 21 arranged in a matrix corresponding to crossings of the plural scan lines SL and the plural bus lines BL.

A sensor 24 in the signal input circuit 21 indicates one element (cell) in a photosensitive element array provided in the infrared sensor (photosensitive portion) 5. The signal input circuit 21 is provided for every one of the sensors 24 of the photosensitive element array. The sensor 24 is coupled to the signal input circuit 21 provided in the reading circuit unit 6 by an In-bump 7.

A reset signal S2 is applied to a transistor Tr6 of the signal input circuit 21, so that a current flows through the transistor Tr6 and that an integral capacitor C1 is charged up to a particular value. While an integral signal S1 is being applied to a transistor Tr5 after the application of the signal S2 stops, a current corresponding to infrared rays intensity flows through the sensor 24 and a voltage of the transistor Tr5 grows to a voltage corresponding to the infrared rays intensity. Sample/hold (S/L) signals S3 and /S3 are applied to a transfer gate SW1, and the voltage of the integral capacitor C1 is transferred to and held by an S/L capacitor C2. The signal input circuits 21 each carry out such an operation, and a voltage corresponding to the infrared rays intensity of each of the sensors is held by the S/L capacitor C2.

A vertical scan shift register 22 serially outputs scan pulses for choosing the plural scan lines SL one by one. Currents flow in response to the scan pulse through the transistors Tr2 whose gates are coupled to the chosen scan line, and the voltages held by the S/L capacitors C2 of the signal input circuits 21 of the chosen scan line are output to the plural vertical bus lines BL through the transistors Tr1 and Tr2. A horizontal scan register 23 serially applies reading pulses to the transistors Tr3. Voltages on the vertical scan bus lines BL are serially output, via a reading line 26, from a final output stage amplifier 24 to an output line 25 as an analog output signal Vout in response to the reading pulses. After the voltage outputs of the entire vertical scan lines BL end, the vertical scan shift register 22 applies a scan pulse to the next scan line SL. The above operations are repeated since then, so that the signals of all the two-dimensionally arranged sensors 24 are multiplexed and output onto the one output line. The transistor Tr4 is turned on depending upon a signal S4 so as to reset and ground the reading line 26.

Thus, as illustrated in FIG. 4A, a signal of one frame that corresponds to one screen is output in such a way as to form a cluster for every line. If the number of the scan lines SL is N, a signal including N clusters is output. Each of the clusters includes the analog output signals Vout as many as the number of the vertical bus lines BL.

The analog output signal Vout is input to the signal processing circuit 10 and made visual. The A/D converter circuit 11 serially converts the signal of one sensor illustrated in FIG. 4A into a digital signal. As illustrated in FIG. 4B, an amplifier gain, etc., are selected so that the analog output signal Vout changes within an input range R of the A/D converter circuit 11.

FIG. 5 illustrates an exemplary process of the operational circuit 12 of the signal processing circuit 10. The operational circuit 12 identifies which zone of the graph in FIG. 5 (four zones A-D in FIG. 5) a signal voltage of each of the pixels is located in, carries out a correcting operation in reference to offset and gain coefficients provided for every region of the pixels and stored in the memory 13, and finds out a temperature of the object. Such a system for carrying out correction of high accuracy is called a multiple-point correcting system. It is preferable to carry out subtracting processes for every pixel plural times so as to identify the zone of the voltage. It is preferable to carry out multiplying and adding processes for every pixel for the offset and gain correction process. Every pixel and region is provided with one set of the offset and gain coefficients which are stored as a table in the memory 13 (such as, a ROM having a large size). If a highly accurate A/D converter IC is used so that an infrared image of low noise is obtained, words are lengthened in the operational circuit and the memory 13 in which the coefficient table is stored requires a large capacity. In order to mount the highly accurate A/D converter IC on a printed circuit board, it is preferable to separate power supply units for analog and digital circuits from each other so as to prevent noise, and to take measures on wiring patterns for preventing noise caused by a surrounding signal.

In order to obtain a highly precise infrared image, it is preferable to make a pixel format of an infrared sensor as large as 1000 pixels times 1000 pixels, to make an offset and gain coefficient table into a large scale and to work an increase operational circuit that carries out an increasing process within a regular period of time at high speed. Similarly, it is preferable to work an operational circuit at high speed in order to obtain a fast frame rate. In order to provide the infrared device with high performance, the signal processing circuit 10 becomes complicated and is made into a large scale. Thus, it is difficult to implement the infrared device at low cost.

In order to implement a highly precise infrared image or imaging at high speed, it is preferable to A/D-convert an output signal of a large-scale sensor array formed by multiple pixels of infrared imaging elements highly precisely and at a high sampling rate, and to carry out digital signal processing at high speed. There is a problem, however, in that the signal processing circuit 10 that carries out A/D conversion and a correcting operation is made more complicated as the requirement is made to a higher degree, and it becomes difficult to meet the requirement.

As described above, the analog output signal Vout provided by the reading circuit is converted into a digital signal by the A/D converter circuit 11. For instance, a scene having a background temperature around 300K should preferably be made visual with temperature resolution around 0.01K by means of signal processing for an infrared image. The scene having been made visual should preferably be displayed with resolution higher than 15 bits. Taking the signal processing into account, it should preferably be A/D-converted with 16-bit accuracy and at high speed. However, a problem, as described below, exists.

What is ordinarily used for the A/D converter circuit 11 is an A/D converter IC of 14-bit accuracy. An A/D converter IC of 16-bit is quite expensive, and its working speed is limited.

Further, if a high-performance A/D converter IC of 16-bit accuracy is used, ground lines are separated for, e.g., assembly of a printed circuit board (such as, wiring or circuit element arrangements) in order that the highest performance put on a catalog is implemented. In such a case, it is possible for the assembly design to be so difficult that the highest performance cannot be implemented depending upon design conditions.

The operational circuit 12 should preferably carry out an operation process including an addition and a multiplication of 16-bit data with a long word length. A problem arises, however, in that the whole signal processing circuit 10 is rendered very complicated and the cost increases.

SUMMARY

According to an aspect of the embodiment, an imaging device includes a lens; an imaging element on which an image is projected through the lens, the imaging element being configured to convert the image into an electric signal; and a signal processing circuit electrically coupled to the imaging element, wherein the signal processing circuit includes: a zone identifying circuit configured to identify which one of a plurality of level zones a voltage level of an analog output signal is in; a shift voltage generating circuit configured to generate a shift voltage which corresponds to a relevant one of the level zones; an operational amplifier circuit configured to change the analog output signal by means of the shift voltage, the operational amplifier circuit being configured to amplify the changed analog output signal to suit an A/D conversion input range so as to generate an amplified and shifted analog signal; a first A/D converted value calculating circuit configured to A/D-convert the amplified and shifted analog signal so as to calculate a first A/D converted value; and a second A/D converted value calculating circuit configured to calculate a second A/D converted value from the first A/D converted value in accordance with the relevant level zone.

According to another aspect of the embodiment, an A/D converter device includes a zone identifying circuit configured to identify which one of a plurality of level zones a voltage level of an analog output signal is in; a shift voltage generating circuit configured to generate a shift voltage which corresponds to a relevant one of the level zones; an operational amplifier circuit configured to change the analog output signal by means of the shift voltage, the operational amplifier circuit being configured to amplify the changed analog output signal to suit an A/D conversion input range so as to generate an amplified and shifted analog signal; a first A/D converter circuit configured to A/D-convert the amplified and shifted analog signal so as to calculate a first A/D converted value; and a second A/D converted value calculating circuit configured to calculate a second A/D converted value from the first A/D converted value in accordance with the relevant level zone.

According to another aspect of the embodiment, a reading circuit includes a zone identifying circuit configured to identify which one of a plurality of level zones a voltage level of an analog output signal is in; a shift voltage generating circuit configured to generate a shift voltage which corresponds to a relevant one of the level zones; an operational amplifier circuit configured to change the analog output signal by means of the shift voltage, the operational amplifier circuit being configured to amplify the changed analog output signal to suit an A/D conversion input range so as to generate an amplified and shifted analog signal, the operational amplifier circuit being configured to output data indicating the generated amplified and shifted analog signal and the relevant level zone.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 6:
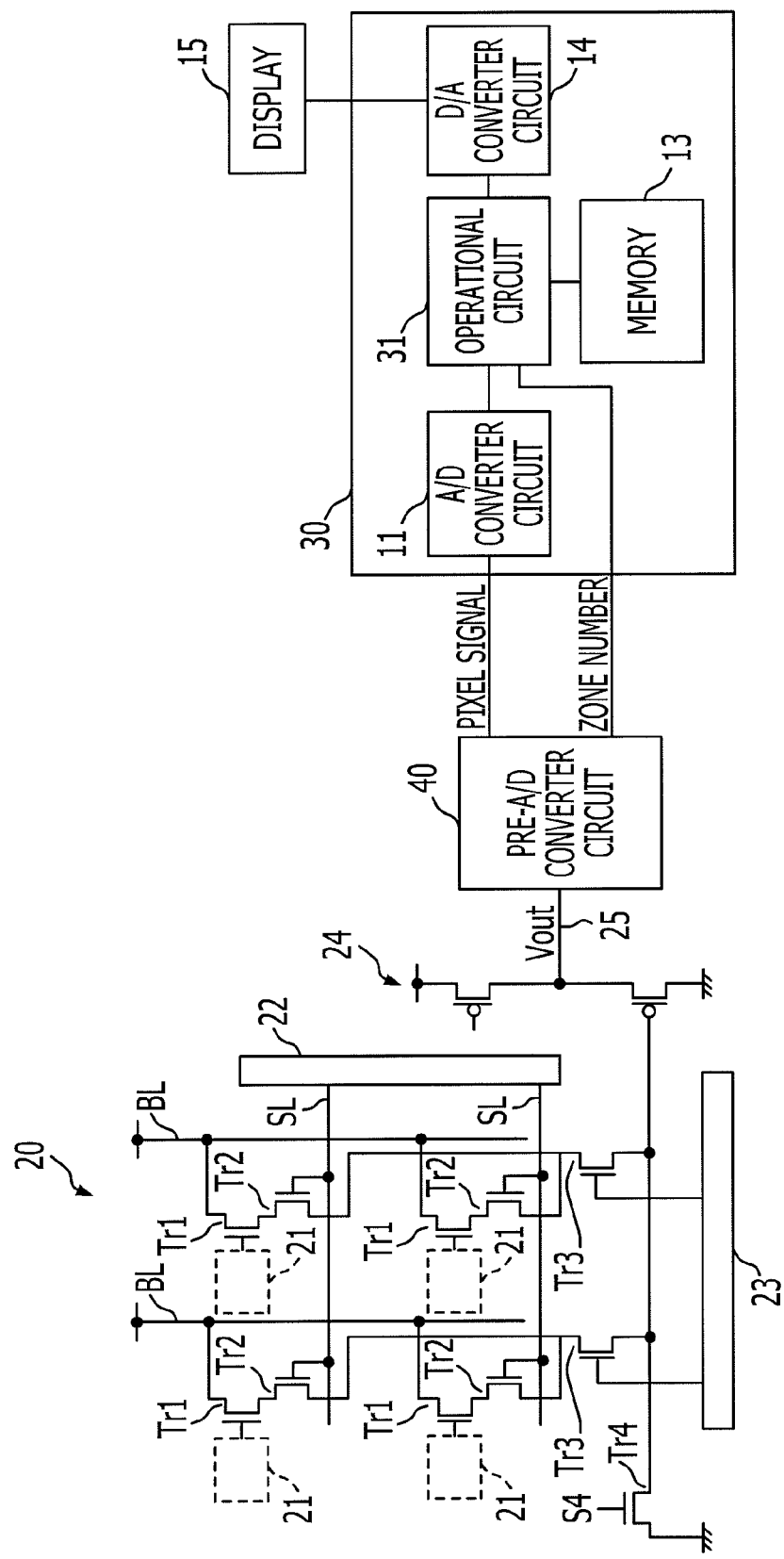
FIG. 6 illustrates an exemplary image system that uses an infrared imaging device of a first embodiment.

FIG. 6 illustrates an exemplary image system that uses an infrared imaging device of a first embodiment. FIG. 6 illustrates a portion of the infrared imaging device 1 provided with a reading circuit 20 and a signal processing circuit 30. As illustrated in FIG. 6, the first embodiment is provided with a pre-A/D converter circuit 40 that processes an analog output signal Vout provided by, e.g., the reading circuit 20 so as to produce a pixel signal and zone number data to be provided to the signal processing circuit 30. The pre-A/D converter circuit 40 can be provided in association with the reading circuit 20 or the signal processing circuit 30 in one chip. Assume, for the following explanation, that an operational circuit 31 is added to the reading circuit 20.

Figure 1:
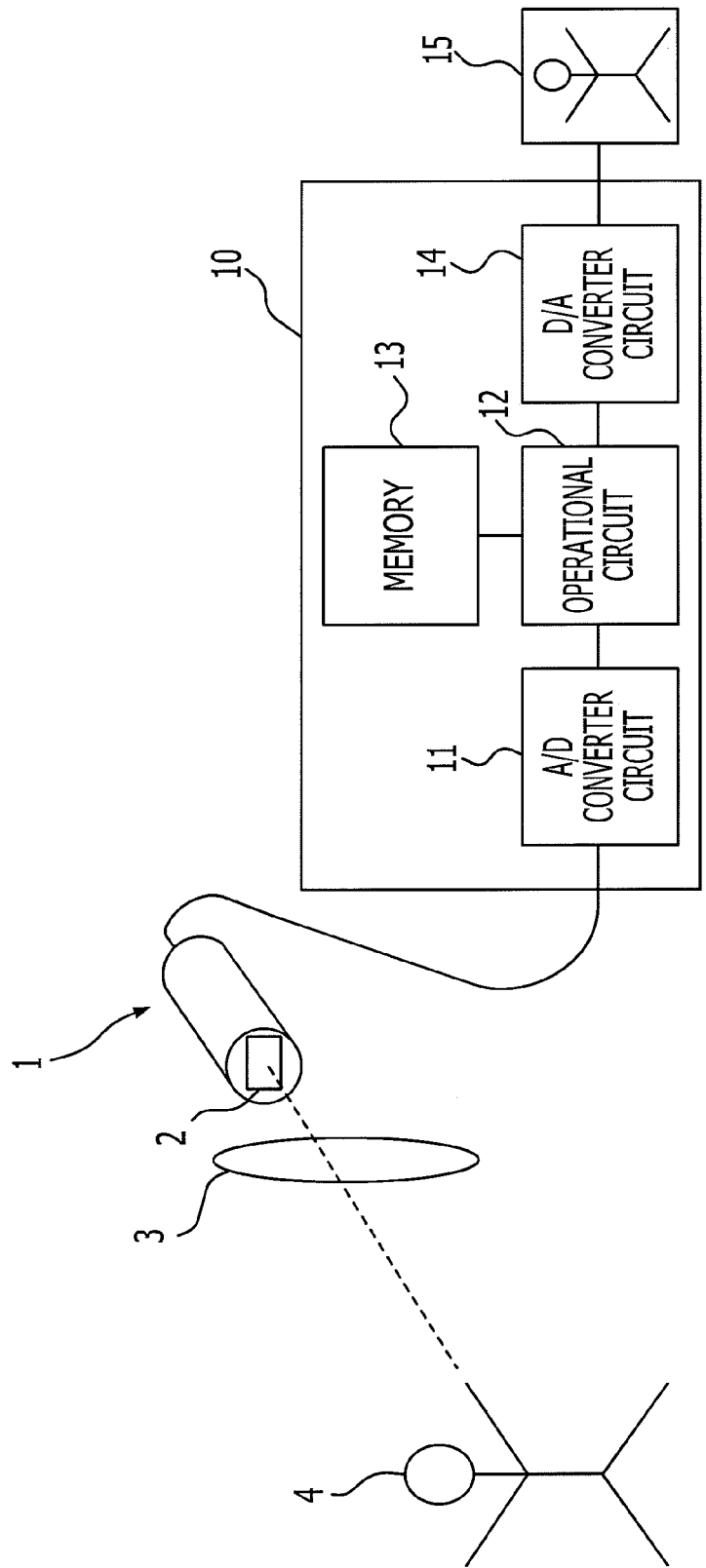
FIG. 1 illustrates an exemplary image system that uses an infrared imaging device.
Figure 2:
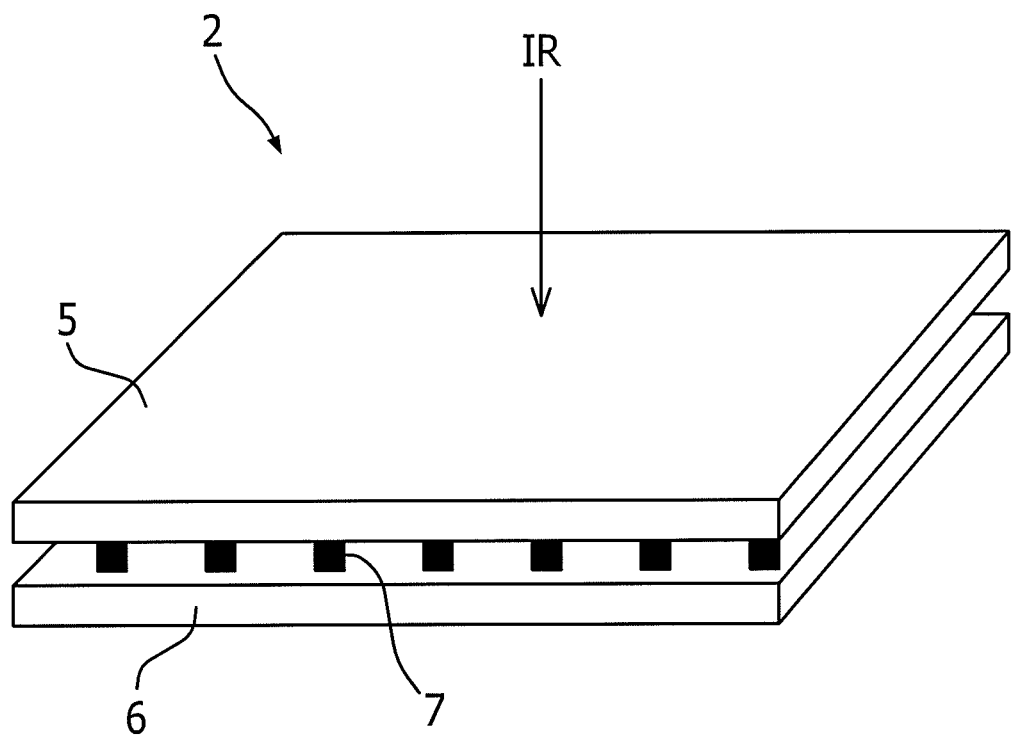
FIG. 2 illustrates an exemplary infrared imaging element (chip)
Figure 3:
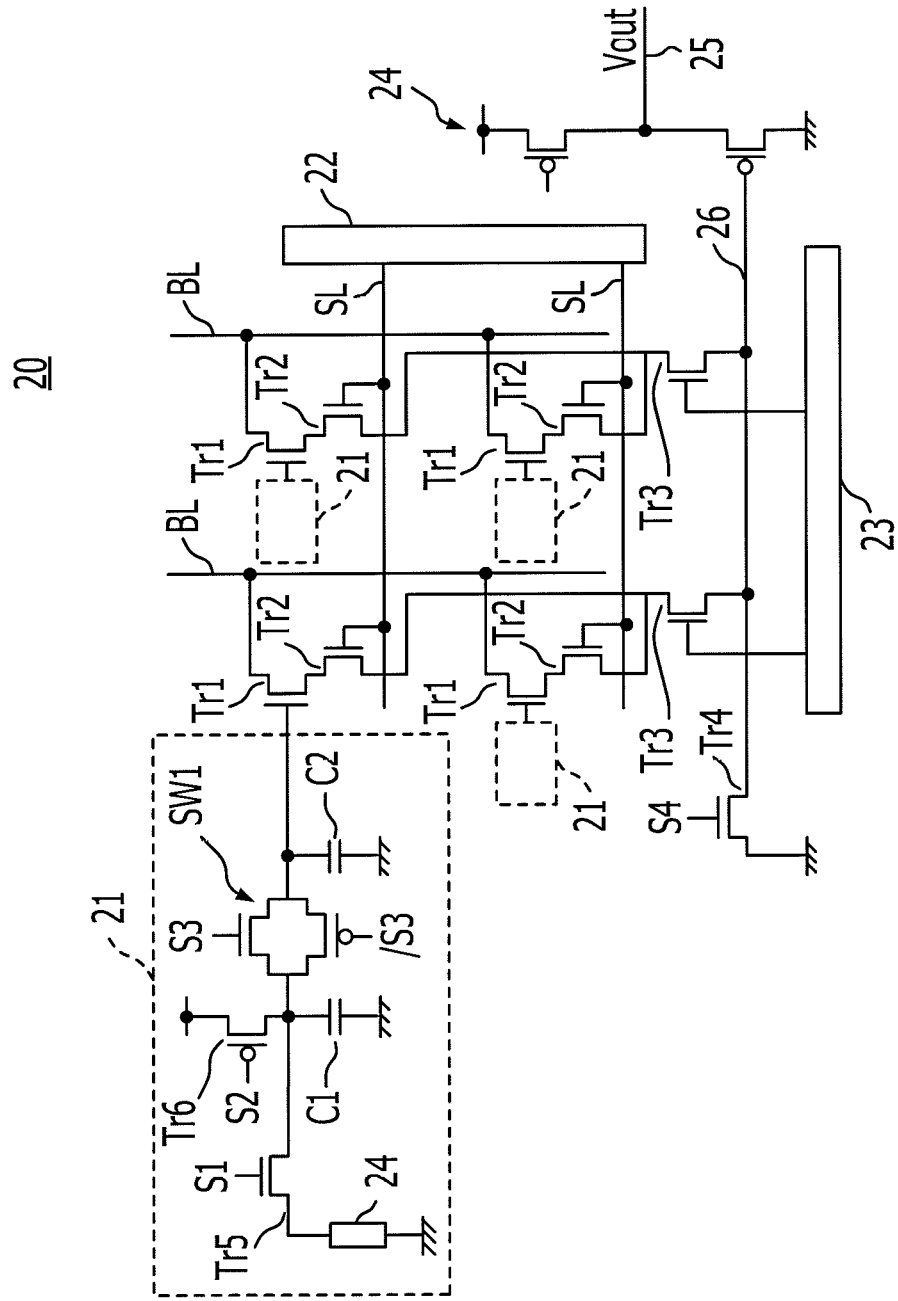
FIG. 3 illustrates an exemplary reading circuit unit.
Figure 4A:
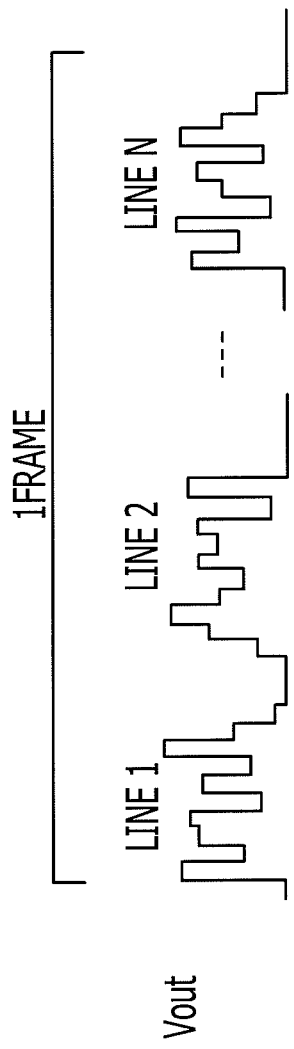
FIGS. 4A and 4B illustrate an output signal of a reading circuit of the infrared imaging element and a relationship between the output signal and an input range of an A/D converter circuit, respectively.
Figure 4B:
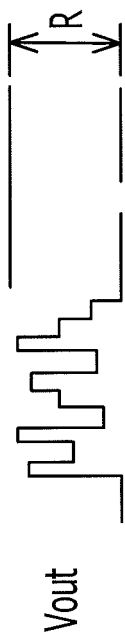
Figure 5:
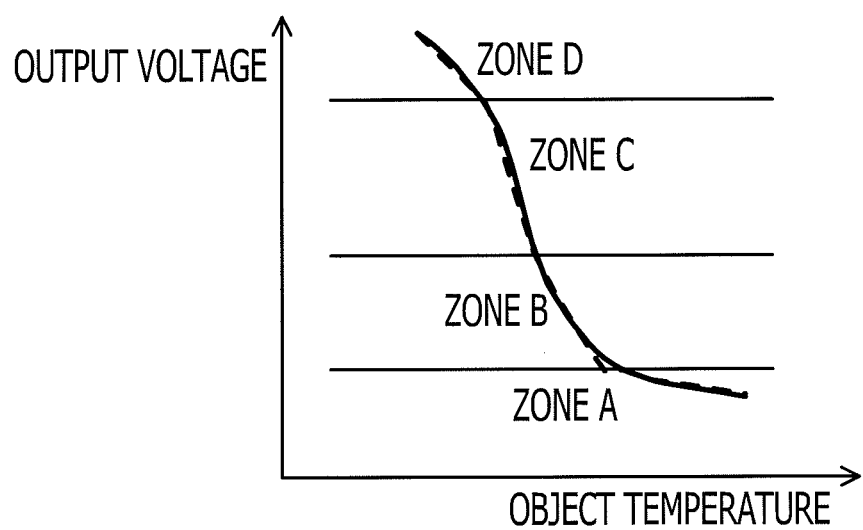
FIG. 5 illustrates an exemplary process of an operational circuit of a signal processing circuit.

As illustrated in FIG. 6, the reading circuit 20 includes a plurality of scan lines SL, a plurality of vertical bus lines BL, a plurality of signal input circuits 21, a vertical scan shift register 22, a horizontal scan shift register 23, transistors Tr1, Tr2, Tr3 and Tr4, and a final output stage amplifier 24. The analog output signal Vout illustrated in FIG. 4A is output from an output line 25. As the reading circuit 20 has the same configuration and similarly works as is illustrated in FIG. 3, further explanation of the reading circuit 20 is omitted.

The signal processing circuit 30 includes, e.g., an A/D converter circuit 11, an operational circuit 31, a memory 13 and a D/A converter circuit 14, and displays an infrared image of an observed object on a display 15. The A/D converter circuit 11 converts a pixel signal provided by the pre-A/D converter circuit 40 into a digital signal. The A/D converter circuit 11 has a resolution lower than that of a corrected digital signal; i.e., the final A/D conversion outcome. The resolution of the corrected digital signal is, e.g., 16 bits; and the resolution of the A/D converter circuit 11 is 14 bits. An offset and gain coefficient table is stored for every zone described later in the memory 13. The operational circuit 31 reads the offset and gain coefficient table according to a zone number provided by the pre-A/D converter circuit 40, corrects the digital signal provided by the A/D converter circuit 11 and produces the corrected digital signal.

Figure 7:
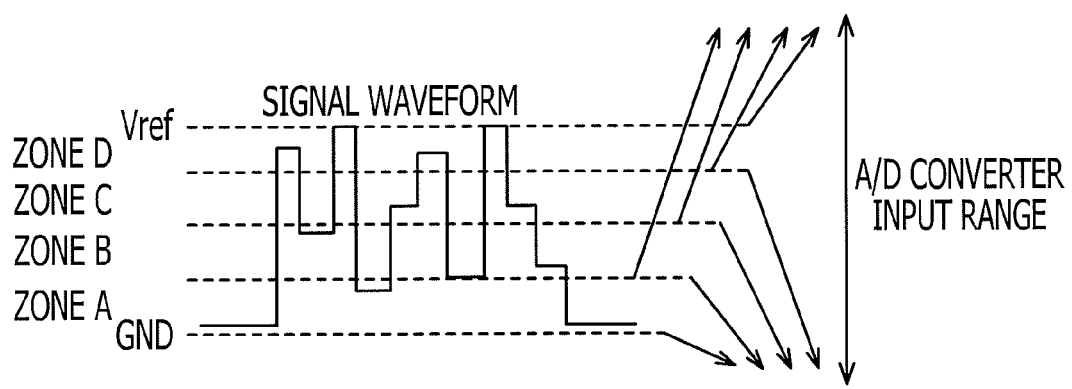
FIG. 7 illustrates an exemplary operation of a pre-A/D converter circuit.
Figure 8:
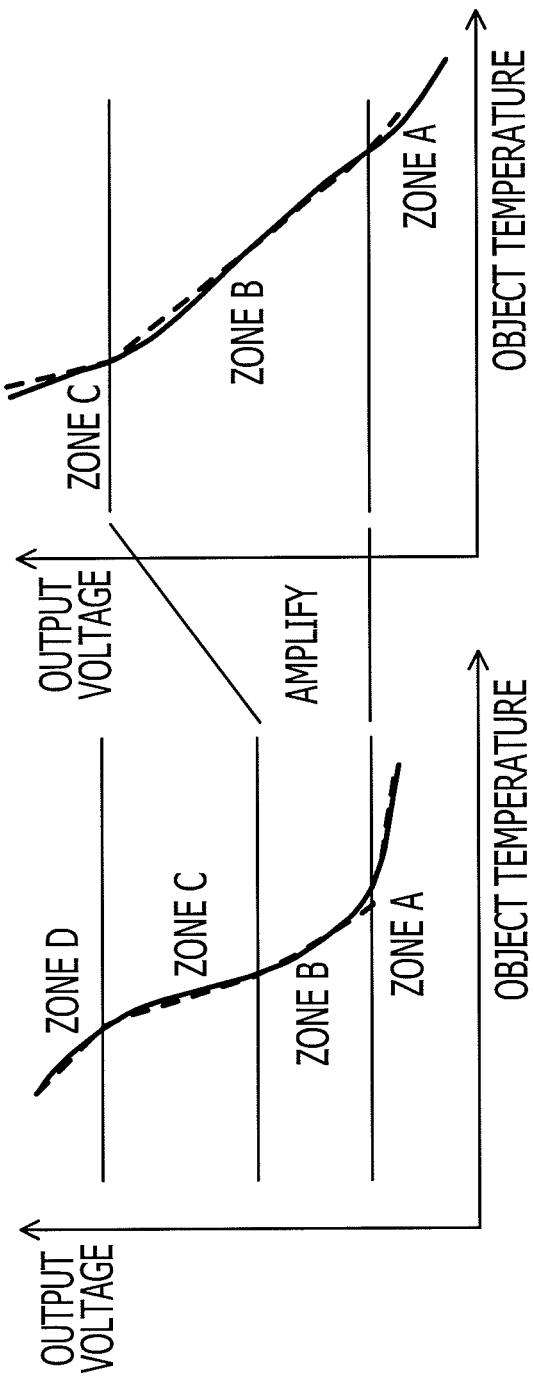
FIG. 8 illustrates how a signal in a zone B is amplified by the pre-A/D converter circuit.

FIG. 7 illustrates an exemplary operation of the pre-A/D converter circuit 40. As illustrated in FIG. 7, a range in which the analog output signal Vout provided by the reading circuit 20 changes (output range) can be divided into four zones A, B, C and D. It is identified which one of the zones the analog output signal Vout is in. The analog output signal Vout is amplified for every zone so as to come into an input range of the A/D converter circuit 11 as illustrated in FIG. 8. For such a process, e.g., the analog output signal Vout is amplified after a shift voltage that makes lower ends of the individual zones particular voltages is subtracted from the analog output signal Vout.

FIG. 8 illustrates how a signal in the zone B is amplified by the pre-A/D converter circuit 40.

Figure 9:
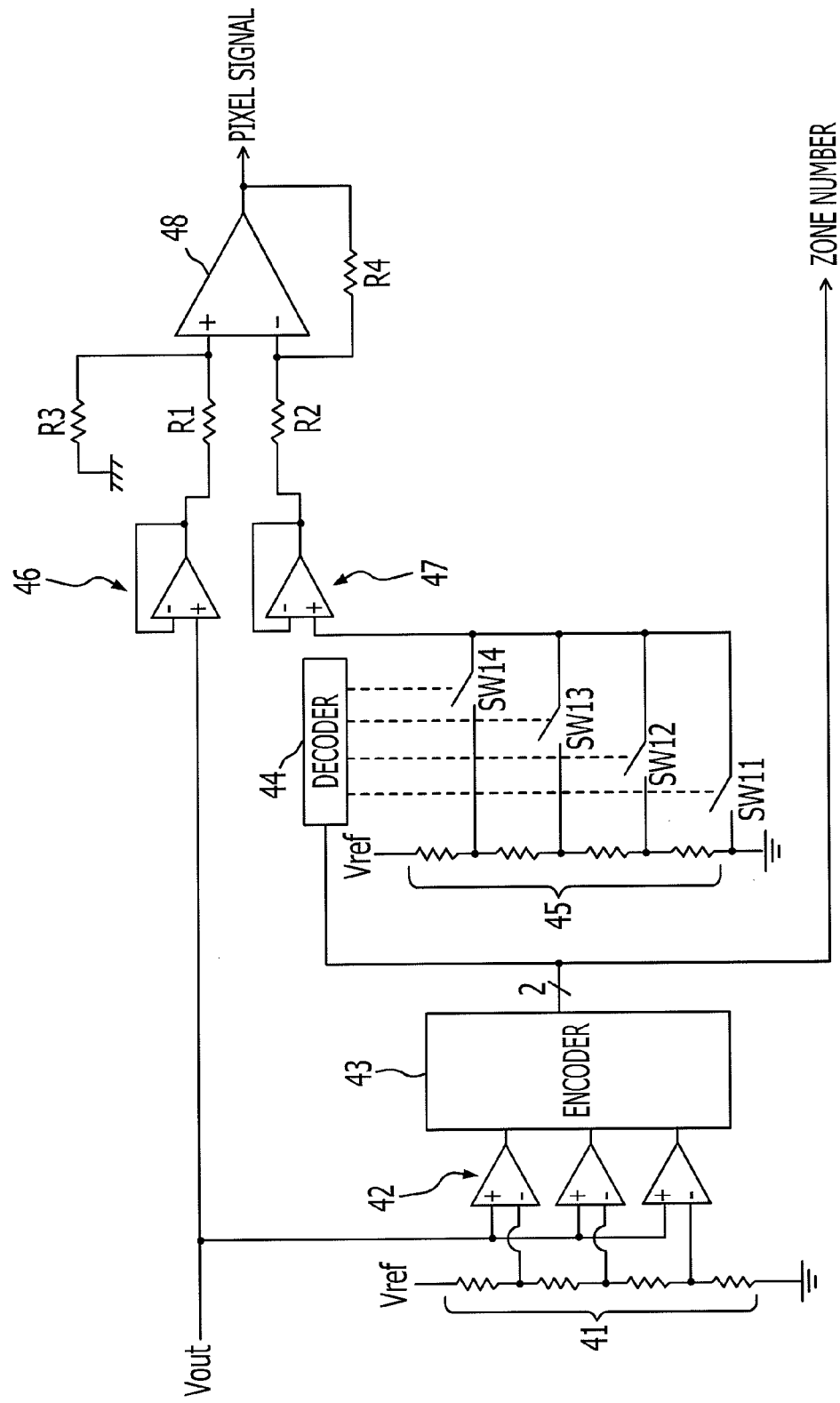
FIG. 9 illustrates an exemplary pre-A/D converter circuit.

FIG. 9 illustrates an exemplary pre-A/D converter circuit 40. As illustrated in FIG. 9, the pre-A/D converter circuit 40 includes a resistor line 41, a comparator line 42, an encoder 43, a decoder 44, a resistor line 45, switches SW11-SW14, driving circuits 46 and 47, operational resistors R1-R4 and an amplifier 48. The amplifier 48 is, e.g., an operational amplifier. The resistor line 41 generates voltages which correspond to interfaces between the above zones A, B, C and D. The comparator line 42 compares the analog output signal Vout with the individual interface voltages generated by the resistor line 41. The encoder 43 produces from the outputs of the comparator line 42 a code indicating which one of the zones the analog output signal Vout comes into. The resistor line 41 of the first embodiment generates voltages which correspond to the interfaces between the zones A and B, B and C, and C and D. If, e.g., the analog output signal Vout comes into the zone C, the outputs of the first and second comparators are "0(L)" (Vout is lower), and the output of the third comparator is "1(H)" (Vout is higher). The encoder 43 identifies from the outputs L, L, H of the comparator line 42 that the analog output signal Vout is in the zone C. The encoder 43 outputs zone numbers (codes) "00", "01", "10" and "11" for the zones A, B, C and D, respectively. The encoder 43 provides the decoder 44 and the operational circuit 31 of the signal processing circuit 30 with the zone numbers.

The resistor line 45 generates a voltage that corresponds to the shift voltage to be subtracted from the analog output signal Vout in a case where the analog output signal Vout is in the zone A, B, C or D. The switches SW11-SW14 choose one of the shift voltages and provides the driving circuit 47 with the chosen shift voltage. The decoder 44 outputs a choosing signal for choosing one of the switches SW11-SW14 in accordance with the zone number.

The driving circuits 46 and 47, the operational resistors R1, R2, R3 and R4 and the amplifier 48 form an operational amplifier circuit of a voltage-follower type. The driving circuits 46 and 47 are provided with the analog output signal Vout and the shift voltage chosen in accordance with the zone, respectively; and the formed operational amplifier circuit subtracts the shift voltage from the analog output signal Vout and amplifies the remainder by a specific gain so as to output the amplified signal as a pixel signal. For instance, let the values of R1-R4 be r1-r4, respectively, and let $4r1=4r2=r3=r4$. Then, the pixel signal is a voltage that is the remainder multiplied by 4 after the shift voltage is subtracted from the voltage of the signal Vout.

Figure 10:
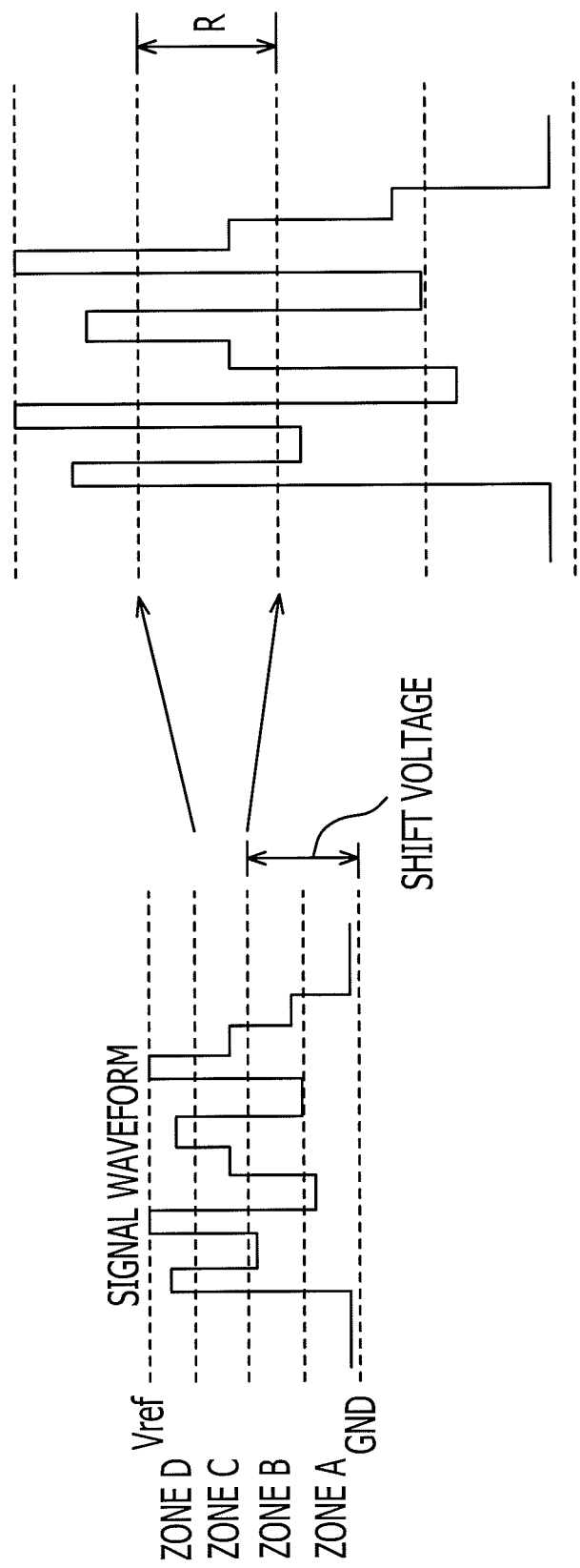
FIG. 10 illustrates a waveform of an analog output signal Vout in a certain zone multiplied by 4.

FIG. 10 illustrates a waveform of the signal Vout multiplied by four in a case where the analog output signal Vout is in the zone C. The analog output signal Vout is amplified so that the portion in the zone C substantially agrees with the input range R of the A/D converter circuit 11. Incidentally, although it appears in FIG. 10 that the signal Vout is amplified as multiplied by four in the zones A, B and D, the signal Vout is saturated in the zones A, B and D on the practical circuit as the zones, except for the zone C, are not used.

If the A/D converter circuit 11 has 14-bit resolution, the values in the zone C are A/D-converted with 14-bit resolution, which produces substantially same resolution as that in a case where all the zones A-D are A/D converted with 16 bits.

Table 1 illustrates relationships among the zone in which the analog output signal Vout is in, the output of the comparator line 42, the output of the encoder 43 and the output of the decoder 44.

TABLE 1

| Vout | Comparator Output | Encoder Output | Decoder Output |
| --- | --- | --- | --- |
| Zone A | 0 for all of three | 00 | ON for the lowest SW, OFF for the rest |
| Zone B | 1 for the lowest, 0 for the rest | 01 | ON for the second lowest SW, OFF for the rest |
| Zone C | 0 for the highest, 1 for the rest | 10 | ON for the second highest SW, OFF for the rest |
| Zone D | 1 for all of three | 11 | ON for the highest SW, OFF for the rest |

The zone number is sent to the operational circuit 31 of the signal processing circuit 30, and is used for a correction process. As described above, the infrared imaging device carries out offset correction and gain correction for sensor signals of individual elements. As different coefficients for correcting the sensor signals are used for the respective elements, a data table including correction coefficients as many as the number of the elements is stored in the memory 13. According to the first embodiment, data tables of different correction coefficients are provided depending upon which one of the zones the analog output signal Vout is in. The data table of the correction coefficients to be used is changed over depending upon the zone number provided by the encoder 43. Even if an A/D converter IC of low resolution is used, an image signal of high resolution can be obtained due to the above signal processing.

Figure 11:
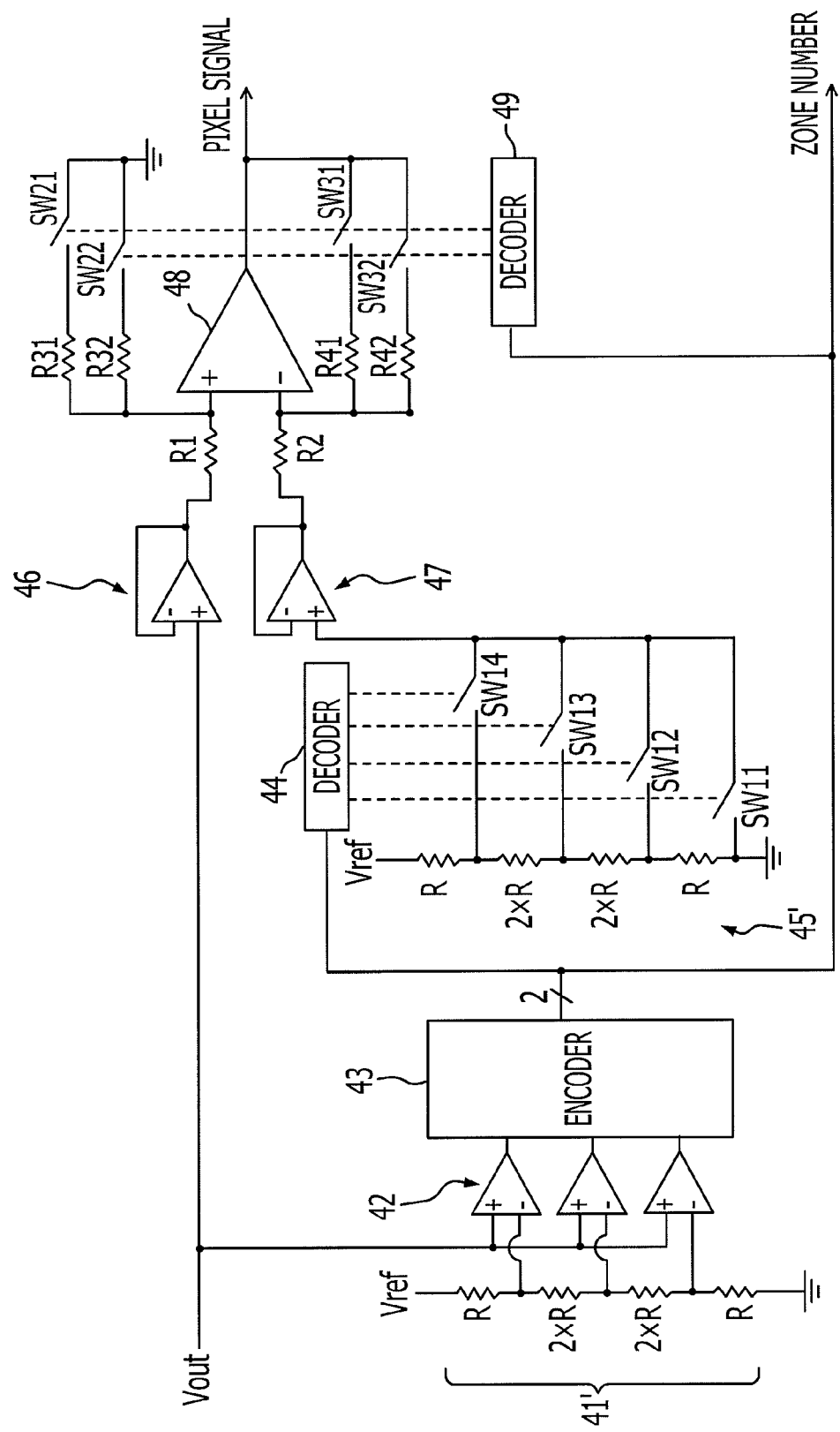
FIG. 11 illustrates an exemplary pre-A/D converter circuit of an image system that uses an infrared imaging device of a second embodiment.

FIG. 11 illustrates an exemplary pre-A/D converter circuit 40 of an image system that uses an infrared imaging device of a second embodiment. The image system of the second embodiment has the same portions as those of the image system of the first embodiment except for the pre-A/D converter circuit 40.

Figure 12:
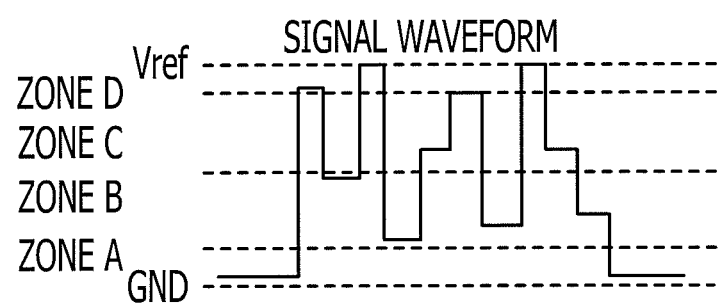
FIG. 12 illustrates how the analog output signal Vout of the second embodiment is divided into zones.

FIG. 12 illustrates how the analog output signal Vout of the second embodiment is divided into zones. As illustrated in FIG. 12, the zones are different in their widths. Thus, the amplifier gain should preferably be changed for every one of the zones in order that the signal range in each of the zones substantially agrees with the input range of the A/D converter circuit. As illustrated in FIG. 12, e.g., the voltage width of the zone B or C is twice as wide as the voltage width of the zone A or D.

Figure 13:
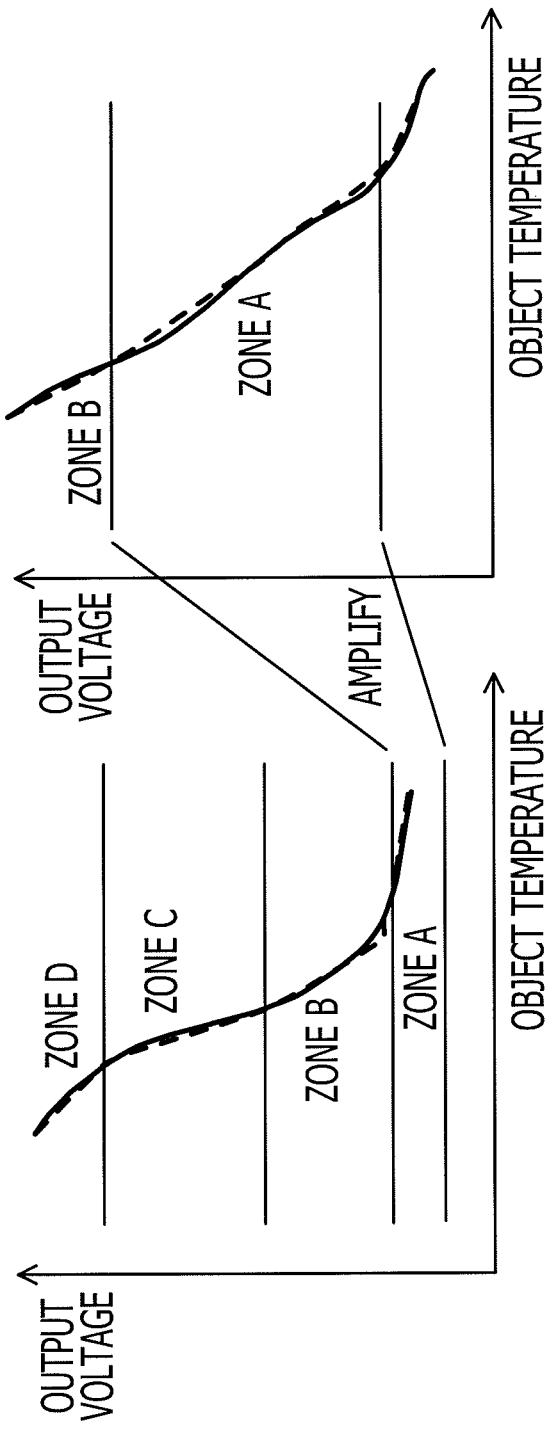
FIG. 13 illustrates how the pre-A/D converter circuit of the second embodiment amplifies a signal in a certain zone.

FIG. 13 illustrates how the pre-A/D converter circuit 40 of the second embodiment amplifies a signal in the zone A. As the voltage range of the analog output signal Vout is smaller in the zone A than in other zones B and C, the amplifier gain for the zone A is made larger than that for the zones B and C, and so is the amplifier gain for the zone D as well.

In referring back to FIG. 11, although having a configuration similar to that of the pre-A/D converter circuit of the first embodiment, the pre-A/D converter circuit of the second embodiment is different from that of the first embodiment in that the voltages of the resistor lines 41' and 45' and the gain of the operational amplifier circuit that uses the amplifier 48 can be selected depending upon the zones. The resistor line 41' has a resistor line formed by resistors coupled in series of a resistance value ratio of, e.g., 1:2:2:1. The resistor line 41' generates interface voltages between the zones A and B, B and C, and C and D. Further, the resistor line 45' has a resistor line formed by resistors coupled in series of a resistance value ratio of, e.g., 1:2:2:1, as well. The resistor line 45' generates shift voltages corresponding to the zones A, B, C and D.

In order to make the gain of the operational amplifier circuit of the second embodiment variable, make the resistance values of the operational resistors R3 and R4 of the first embodiment variable. To put it specifically, replace the operational resistor R3 coupled between the input terminal of the amplifier 48 and the ground with a first resistor-switch line and a second resistor-switch line coupled parallel to each other. The first and second resistor-switch lines are formed by a resistor R31 and a switch SW21 coupled in series and by a resistor R32 and a switch SW22 coupled in series, respectively. Choose and turn on either one of the switches SW21 and SW22 so that the resistance value of the operational resistor R3 changes over between the resistance values of the resistors R31 and R32. Replace the operational resistor R4 coupled between the input and output terminals of the amplifier 48 with a third resistor-switch line and a fourth resistor-switch line coupled parallel to each other. The third and fourth resistor-switch lines are formed by a resistor R41 and a switch SW31 coupled in series and by a resistor R42 and a switch SW32 coupled in series, respectively. Choose and turn on either one of the switches SW31 and SW32 so that the resistance value of the operational resistor R4 changes over between the resistance values of the resistors R41 and R42.

The decoder 49 decodes the zone number provided by the encoder 43 so as to output a choosing signal for controlling the switches SW21, SW22, Sw31 and SW32. The switches SW21 and SW31 are controlled by the same choosing signal. The switches SW22 and SW32 are controlled by the same choosing signal. When the switches SW21 and SW31 are turned on, the switches SW22 and SW32 are turned off. When the switches SW22 and SW32 are turned on, the switches SW21 and SW31 are turned off. If the zone number indicates the zone B or C, the decoder 49 outputs the choosing signal for turning the switches SW21 and SW31 on. If the zone number indicates the zone A or D, the decoder 49 outputs the choosing signal for turning the switches SW22 and SW32 on. The resistance values of the resistors R32 and R42 are twice as large as the resistance values of the resistors R31 and R41; and the gain for the zones A and D is twice as large as the gain for the zones B and C.

Table 2 illustrates relationships of the second embodiment among the zone in which the analog output signal Vout is in, the output of the comparator line 42, the output of the encoder 43 and the output of the decoder 44.

TABLE 2

| Signal voltage of element | Comparator output | Encoder output | Decoder 1 output | Decoder 2 output |
|---|---|---|---|---|
| Zone 0 | 0 for all of three | 00 | ON for the lowest SW, OFF for the rest | ON for 6xR switch, OFF for the rest |
| Zone 1 | 1 for the lowest, 0 for the rest | 01 | ON for the second lowest SW, OFF for the rest | ON for 3xR switch, OFF for the rest |
| Zone 2 | 0 for the highest, 1 for the rest | 10 | ON for the second highest SW, OFF the rest | ON for 3xR switch, OFF for the rest |
| Zone 3 | 1 for all of three | 11 | ON for the highest SW, OFF for the rest | ON for 6xR switch, OFF for the rest |

Figure 14:
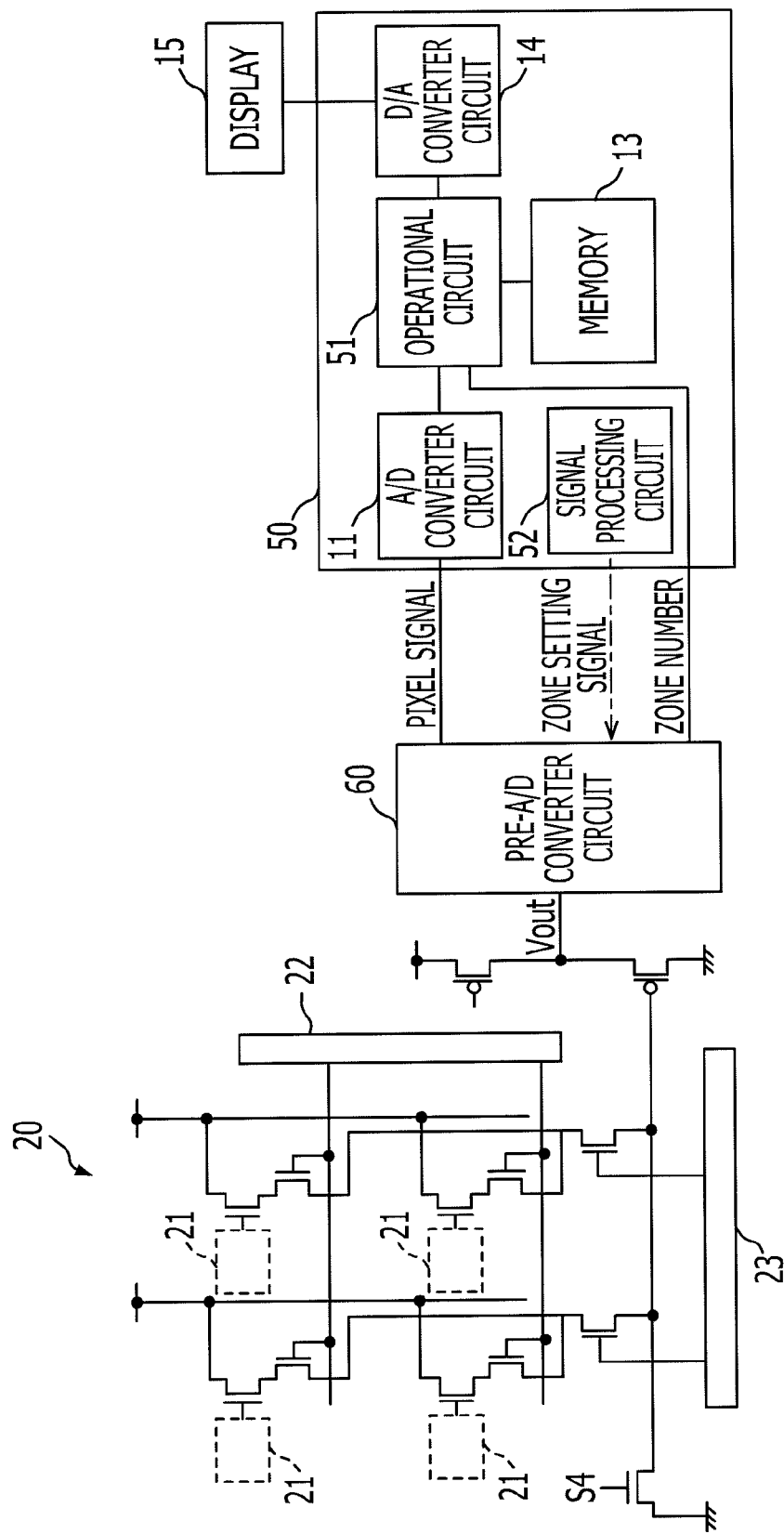
FIG. 14 illustrates an exemplary image system that uses an infrared imaging device of a third embodiment.

FIG. 14 illustrates an exemplary image system that uses an infrared imaging device of a third embodiment. As illustrated in FIG. 14, the image system of the third embodiment includes the reading circuit 20 provided in the infrared imaging device 1, a pre-A/D converter circuit 60 and a signal processing circuit 50. The reading circuit 20 is substantially the same as that of the first embodiment. Further, the pre-A/D converter circuit 60 and the signal processing circuit 50 have configurations similar to those of the pre-A/D converter circuit 40 and the signal processing circuit 30 of the first embodiment, respectively. They are different, however, in that a signal processing circuit 52 of the signal processing circuit 50 outputs a zone setting signal and the pre-A/D converter circuit 60 changes the zone depending upon the zone setting signal. The zone setting signal is set when the image system is initialized.

Figure 15:
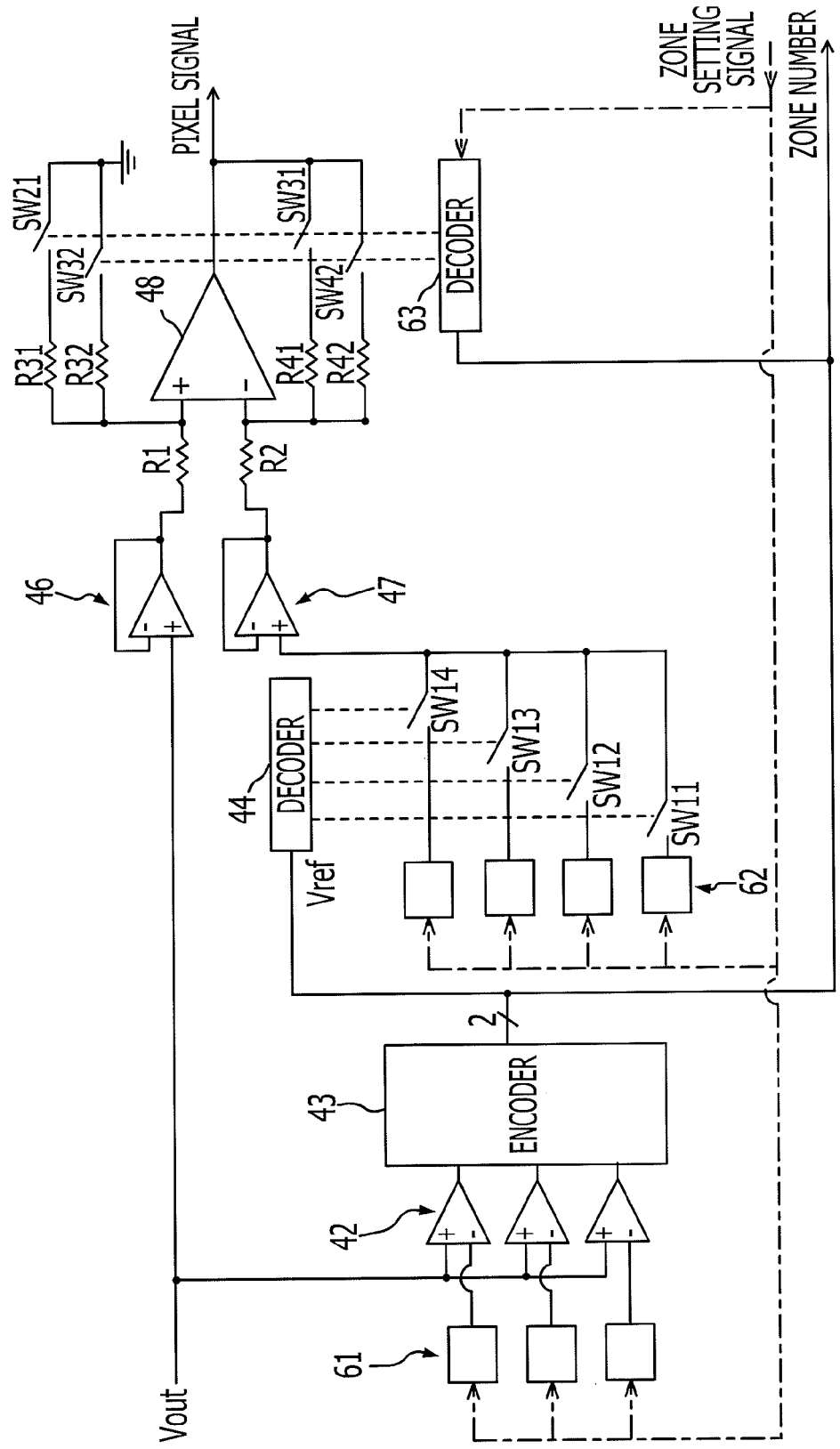
FIG. 15 illustrates an exemplary pre-A/D converter circuit of the infrared imaging device of the third embodiment.

FIG. 15 illustrates an exemplary pre-A/D converter circuit 60 of the infrared imaging device of the third embodiment. As illustrated in FIG. 15, although having a configuration similar to that of the pre-A/D converter circuit of the second embodiment, the pre-A/D converter circuit 60 of the third embodiment is different from that of the second embodiment in that the resistor lines 41' and 45' are replaced with a D/A converter line 61 formed by three D/A converters and a D/A converter line 62 formed by four D/A converters, respectively. The D/A converter lines 61 and 62 output interface voltages and shift voltages in accordance with the zone setting signal, respectively. The pre-A/D converter circuit 60 can thereby be free to set the interface voltages and the shift voltages of the zones in line with variations in the characteristics of the photosensitive element arrays of the infrared imaging element. An SRAM can be used as, e.g., a decoder 63. Write data from the signal processing circuit into individual addresses in advance. Provide the address with an output of the encoder 43. Connect to data lines control lines of the switches coupled to the resistors in series. The gain of the operational amplifier circuit can thereby be changed depending upon the output of the encoder 43 in accordance with a preset association.

Table 3 illustrates relationships of the third embodiment among the zone in which the analog output signal Vout is in the output of the comparator line 42, the output of the encoder 43 and the output of the decoder 44.

TABLE 3

| Signal voltage of element | Comparator output | Encoder output | Decoder 1 output | Decoder 2 output |
|---|---|---|---|---|
| Zone 0 | 0 for all of three | 00 | ON for the lowest SW, OFF for the rest | ON for N1xR switch, OFF for the rest |
| Zone 1 | 1 for the lowest, 0 for the rest | 01 | ON for the second lowest SW, OFF for the rest | ON for N1xR and N2xR switches |
| Zone 2 | 0 for the highest, 1 for the rest | 10 | ON for the second highest SW, OFF for the rest | ON for N1xR and N2xR switches |
| Zone 3 | 1 for all of three | 11 | ON for the highest SW, OFF for the rest | ON for N2xR switch, OFF for the rest |

Incidentally, the configuration of the third embodiment can be set to three types in cases where the switches SW21 and SW31 are turned on, the switches SW22 and SW32 are turned on, and the switches SW21, SW22, SW31 and SW32 are turned on.

The zone setting signal of the third embodiment is set in accordance with variations in the characteristics of the photosensitive element arrays of the infrared imaging element, etc., when the image system is initialized. Measure a relationship between the analog output signal Vout and the temperature of the object when the chip is manufactured or the image system is in maintenance so as to select the zone setting signal and correction coefficients.

Figure 16:
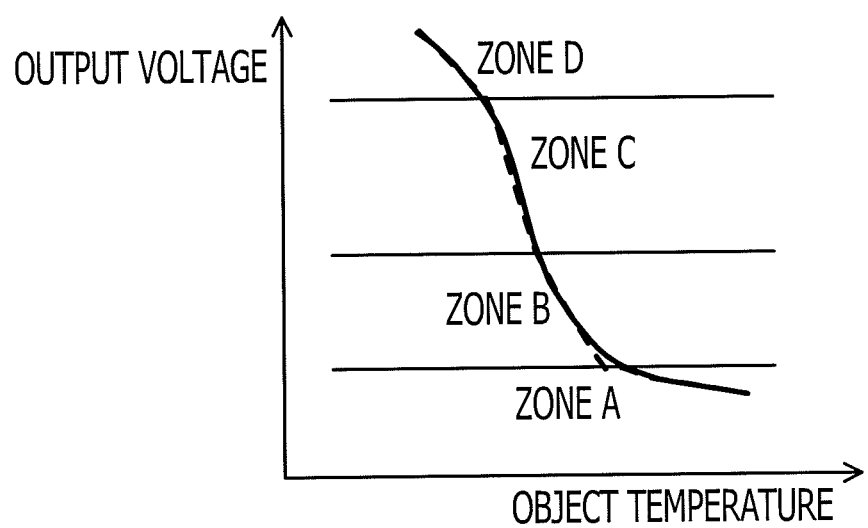
FIG. 16 illustrates an exemplary relationship between the signal Vout and object temperature.

FIG. 16 illustrates an exemplary relationship between the signal Vout and the object temperature. A solid line represents measured values. Approximate the solid line by dotted straight lines so as to select the correction coefficients. In order to capture an image by using the correction coefficients, find out the object temperature from measured voltages by means of interpolation, and convert high and low temperatures into brightness so as to make an infrared image. Thus, in order that the output voltage range is divided into a plurality of zones, the interface voltages between the zones can be suitably selected so that an error caused by the solid line approximated by the dotted lines is made as small as possible. Incidentally, the data set to the D/A converter lines when the system is activated as explained above can be set while an image is being captured instead. Further, if the setting operation can be carried out in the middle of capturing an image of one frame, the setting can be changed for every sensor element in the photosensitive element array. Even if the variations in the characteristics of the photosensitive element arrays are large in that case, interpolation of small errors can be done and an infrared image of low noise can be obtained.

Figure 17:
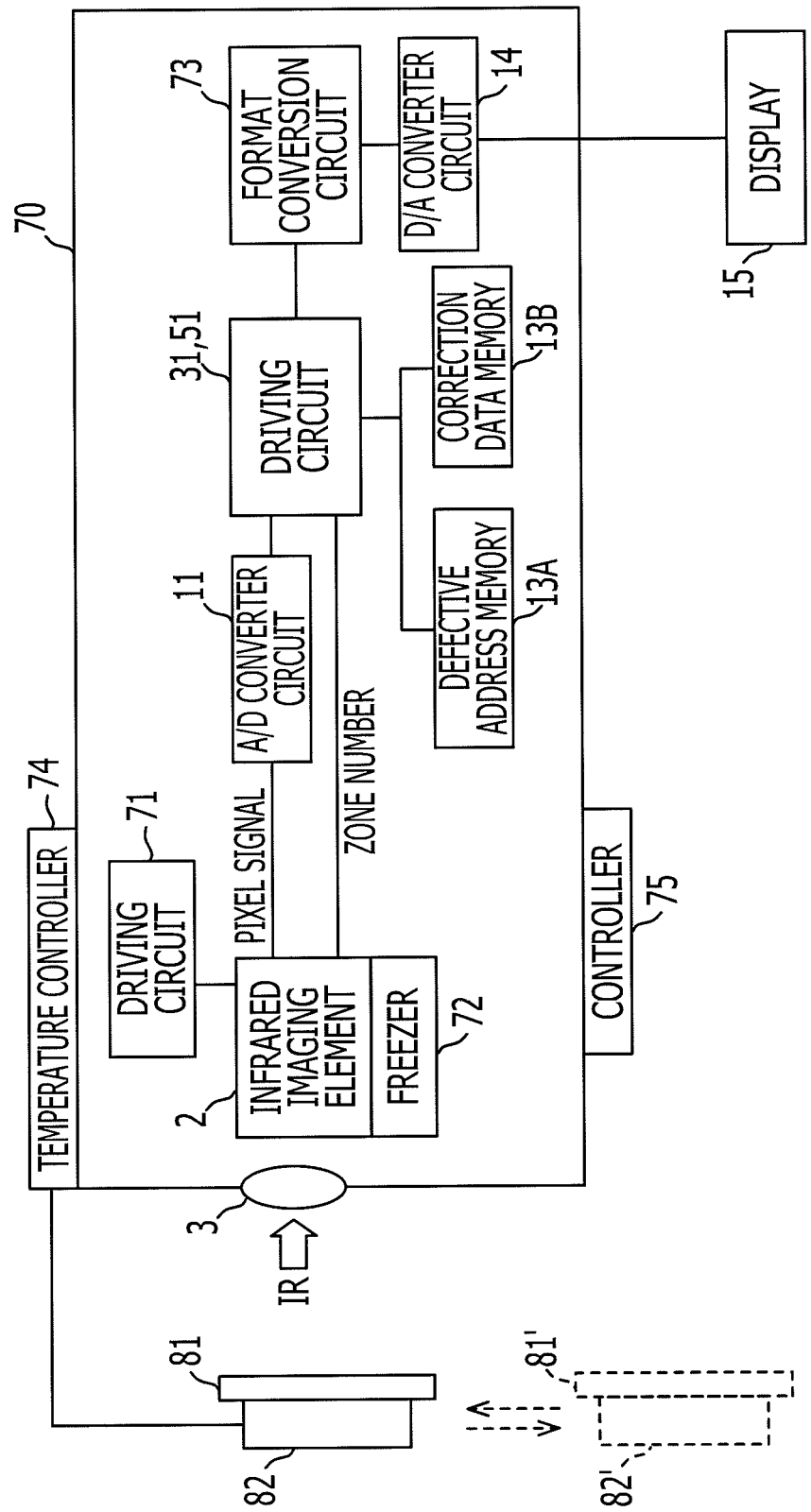
FIG. 17 illustrates an exemplary measuring system for obtaining a zone setting signal and correction coefficients for offset and gain correction, etc., in accordance with an infrared imaging element to be used when the image system of one of the first to third embodiments is initialized.

FIG. 17 illustrates an exemplary measuring system for obtaining a zone setting signal and correction coefficients for offset and gain correction, etc., in accordance with an infrared imaging element to be used when the image system of one of the first to third embodiments is initialized.

The infrared imaging element 2 to be measured is measured while including the reading circuit 20 and being mounted on an image system 70. Although including the pre-A/D converter circuit 40 or 60, the reading circuit 20 is configured to bypass the pre-A/D converter circuit, and directly outputs the analog output signal Vout when the infrared imaging element 2 is measured.

The image system 70 includes the lens 3, a driving circuit 71, a freezer 72, the A/D converter circuit 11, the operational circuit 31 or 51, a defective address memory 13A, a correction data memory 13B, a format conversion circuit 73, the D/A converter circuit 14, a controller 75 that controls the whole system and a temperature controller 74. In FIG. 17, reference numerals 81 and 82 indicate a metallic plate that is an infrared rays source for calibration and a Peltier element that controls the temperature of the metallic plate 81, respectively. The metallic plate 81 is, e.g., painted with mat black on the surface, and is regarded as a black body. The metallic plate 81 and the Peltier element 82 can move between states in and out of view from the infrared imaging element 2 by means of a moving mechanism not illustrated in FIG. 17.

The infrared imaging element 2 can be cooled down to an extreme low temperature by the freezer 72. The freezer 72 is temperature-controlled by, e.g., the temperature controller 74. The lens 3 projects infrared rays IR coming from the metallic plate 82 onto a light-receiving face of the infrared imaging element 2. The infrared imaging element 2 is driven by the driving circuit 71 and outputs a signal that corresponds to the projected infrared image. Although expected to output a signal of constant intensity that corresponds to the temperature of the metallic plate 81 as the image of the metallic plate 81 being even is projected, the infrared imaging element 2 practically outputs a signal being uneven due to the variations of the characteristics. Measure the variations of the characteristics, and make correction data for every element.

As described above, the reading circuit 20 of the infrared imaging element 2 bypasses the pre-A/D converter circuit 40 or 60 for measurement and directly outputs the analog output signal Vout. The analog output signal Vout is converted into a digital signal (pixel data) by the A/D converter circuit 11, and is input to the operational circuit 31 or 51. The operational circuit 31 or 51 stores the digital signal provided by the A/D converter circuit 11 in memory for measurement in connection with the temperature of the metallic plate 81 at that moment. An operational circuit and a memory for exclusive calibration use provided outside can be used as necessary so that the digital signal is stored in the memory.

The imaging system of the first embodiment selects offset and gain correction data from the data for every one of the four fixed zones, and stores the correction data in the correction data memory 13B. If the operational circuit and the memory for exclusive calibration use provided outside are used so that the measurement is carried out as described above, the correction data memory 13B is loaded with correction data selected outside.

As it is difficult for the infrared imaging element 2 not to have a defective element, the infrared imaging element 2 should preferably, e.g., store an address of a defective element in the defective address memory 13A, and carry out a process for replacing a pixel output of the defective element with image data of an adjacent element.

Image data produced by the operational circuit 31 or 51 is converted into a specific format by the format conversion circuit 73, further converted into an analog signal by the D/A converter circuit 14 and then displayed on the display 15.

After the above measurement process is completed, move the metallic plate 81 and the Peltier element 82 to the state out of view, suitably capture an image of an object and check the operation.

The imaging system of the second embodiment measures an average characteristic of the manufactured infrared imaging element 2 and selects the division into zones in advance. The operation except for that is substantially the same as explained as to the imaging system of the first embodiment.

The imaging system of the third embodiment selects how to divide the range into the zones from measured data collected by capturing an image of the metallic plate 81. An operator, e.g., carries out the selection process. The operation except for that is substantially the same as explained as to the imaging system of the first embodiment.

The first to third embodiments have been explained above, and those embodiments can be variously modified. As to the first to third embodiments, the pre-A/D converter circuit is, e.g., provided as a portion of the reading circuit. The pre-A/D converter circuit can be provided, however, outside the reading circuit independently, or as a portion of the signal processing circuit.

Further, the pre-A/D converter circuit of the first to third embodiments divide the range of the analog output signal into, e.g., four zones. The range can be divided, however, into two or eight zones.

Further, the first to third embodiments have exemplified an imaging system that uses an infrared imaging element. The configurations of the first to third embodiments can be applied to a multiple-element sensor.

If the pre-A/D converter circuit is added to the reading circuit, as described above, and even if an A/D converter IC of relatively low accuracy is used, the image system can capture an infrared image which is as highly accurate as that in a case where an A/D converter IC of high accuracy is used. Further, the image system can implement a highly accurate multiple-point correcting system without using a digital subtracting circuit. Since a correction coefficient of a short word length can be used for a correction operation, capacity of the ROM in which a correction coefficient table is stored or a scale of the operational circuit can be reduced. Consequently, a relatively small-sized external circuit can be used so that an imaging device of high frame rates for infrared images of high accuracy can be implemented, and a high-performance device can be provided at low cost.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An imaging device, comprising:
   a lens;
   an imaging element on which an image is projected through the lens, the imaging element being configured to convert the image into an electric signal; and
   a signal processing circuit electrically coupled to the imaging element, wherein the signal processing circuit includes:
   a zone identifying circuit configured to identify which one of a plurality of level zones a voltage level of an analog output signal is in,
   a shift voltage generating circuit configured to generate a shift voltage which corresponds to a relevant one of the level zones, an operational amplifier circuit configured to change the analog output signal by means of the shift voltage, the operational amplifier circuit being configured to amplify the changed analog output signal to suit an A/D conversion input range so as to generate an amplified and shifted analog signal, a first A/D converted value calculating circuit configured to A/D-convert the amplified and shifted analog signal so as to calculate a first A/D converted value, and a second A/D converted value calculating circuit configured to calculate a second A/D converted value from the first A/D converted value in accordance with the relevant level zone.

2. The imaging device according to claim 1, wherein the analog output signal is read from the imaging element.

3. The imaging device according to claim 1, wherein the zone identifying circuit includes:

a zone reference voltage generating circuit configured to generate a plurality of zone reference voltages which corresponds to a plurality of interfaces between the plural level zones, a plurality of comparators configured to compare the analog output signal with each of the plural zone reference voltages, and an encoder configured to produce from a compared result of the plural comparators a code which indicates the relevant level zone.

4. The imaging device according to claim 1, wherein the shift voltage generating circuit includes:

a reference shift voltage generating circuit configured to generate a plurality of reference shift voltages which corresponds to the plural level zones, and a shift choosing circuit configured to choose a relevant reference shift voltage from the plural reference shift voltages on the basis of the code produced by the encoder so as to output the chosen reference shift voltage as the shift voltage.

5. An A/D converter device, comprising:

a zone identifying circuit configured to identify which one of a plurality of level zones a voltage level of an analog output signal is in;

a shift voltage generating circuit configured to generate a shift voltage which corresponds to a relevant one of the level zones;

an operational amplifier circuit configured to change the analog output signal by means of the shift voltage, the operational amplifier circuit being configured to amplify the changed analog output signal to suit an A/D conversion input range so as to generate an amplified and shifted analog signal;

a first A/D converter circuit configured to A/D-convert the amplified and shifted analog signal so as to calculate a first A/D converted value; and a second A/D converted value calculating circuit configured to calculate a second A/D converted value from the first A/D converted value in accordance with the relevant level zone.

6. The A/D converter device according to claim 5, wherein the analog output signal is read from an imaging element.

7. The A/D converter device according to claim 5, wherein the zone identifying circuit includes:

a zone reference voltage generating circuit configured to generate a plurality of zone reference voltages which corresponds to a plurality of interfaces between the plural level zones, a plurality of comparators configured to compare the analog output signal with each of the plural zone reference voltages, and an encoder configured to produce from a compared result of the plural comparators a code which indicates the relevant level zone.

8. The A/D converter device according to claim 5, wherein the shift voltage generating circuit includes:

a reference shift voltage generating circuit configured to generate a plurality of reference shift voltages which corresponds to the plural level zones, and a shift choosing circuit configured to choose a relevant reference shift voltage from the plural reference shift voltages on the basis of the code produced by the encoder so as to output the chosen reference shift voltage as the shift voltage.

9. The A/D converter device according to claim 5, wherein the operational amplifier circuit is configured to subtract the shift voltage from the analog output signal.

10. The A/D converter device according to claim 5, wherein:

at least some of the plural level zones is different in voltage range width, and the operational amplifier circuit is configured to change an amplifier gain depending upon the relevant level zone.

11. The A/D converter device according to claim 10, wherein the operational amplifier circuit includes:

an amplifier configured to be provided with the analog output signal and the shift voltage, a plurality of resistors included in a feedback circuit of the amplifier, and a gain choosing circuit configured to choose one of the plural resistors included in the feedback circuit on the basis of the code produced by the encoder, wherein the amplifier gain is selected depending upon the chosen resistor.

12. The A/D converter device according to claim 5, wherein:

the zone identifying circuit includes a zone reference voltage generating circuit configured to generate a plurality of zone reference voltages which corresponds to a plurality of interfaces between the plural level zones, the zone identifying circuit including a plurality of comparators configured to compare the analog output signal with each of the plural zone reference voltages, the zone identifying circuit including an encoder configured to produce from a compared result of the plural comparators a code which indicates the relevant level zone, the shift voltage generating circuit includes a reference shift voltage generating circuit configured to generate a plurality of reference shift voltages which corresponds to the plural level zones, the shift voltage generating circuit including a shift choosing circuit configured to choose a relevant reference shift voltage from the plural reference shift voltages on the basis of the code produced by the encoder so as to output the chosen reference shift voltage as the shift voltage, the operational amplifier circuit is a variable operational amplifier circuit configured to change an amplifier gain, the zone reference voltage generating circuit is configured to change the plural generated zone reference voltages, the reference shift voltage generating circuit is configured to change the plural generated reference shift voltages, and the operational amplifier circuit changes the amplifier gain depending upon the changed plural generated zone reference voltages and the changed plural reference shift voltages.

13. A reading circuit, comprising:
a zone identifying circuit configured to identify which one of a plurality of level zones a voltage level of an analog output signal is in;
a shift voltage generating circuit configured to generate a shift voltage which corresponds to a relevant one of the level zones;
an operational amplifier circuit configured to change the analog output signal by means of the shift voltage, the operational amplifier circuit being configured to amplify the changed analog output signal to suit an A/D conversion input range so as to generate an amplified and shifted analog signal, the operational amplifier circuit being configured to output data indicating the generated amplified and shifted analog signal and the relevant level zone.

14. The reading circuit according to claim 13, wherein the analog output signal is read from an imaging element.

15. The reading circuit according to claim 13, wherein the zone identifying circuit includes:
a zone reference voltage generating circuit configured to generate a plurality of zone reference voltages which corresponds to a plurality of interfaces between the plural level zones,
a plurality of comparators configured to compare the analog output signal with each of the plural zone reference voltages, and
an encoder configured to produce from a compared result of the plural comparators a code which indicates the relevant level zone.

16. The reading circuit according to claim 13, wherein the shift voltage generating circuit includes:
a reference shift voltage generating circuit configured to generate a plurality of reference shift voltages which corresponds to the plural level zones, and
a shift choosing circuit configured to choose a relevant reference shift voltage from the plural reference shift voltages on the basis of the code produced by the encoder so as to output the chosen reference shift voltage as the shift voltage.

17. The reading circuit according to claim 13, wherein the operational amplifier circuit is configured to subtract the shift voltage from the analog output signal.

18. The reading circuit according to claim 13, wherein:
at least some of the plural level zones is different in voltage range width, and
the operational amplifier circuit is a variable operational amplifier circuit configured to change an amplifier gain depending upon the relevant level zone.

19. The reading circuit according to claim 18, wherein the operational amplifier circuit includes:
an amplifier configured to be provided with the analog output signal and the shift voltage,
a plurality of resistors which forms a feedback circuit of the amplifier, and
a gain choosing circuit configured to choose one of the plural resistors which forms the feedback circuit on the basis of the code produced by the encoder, the gain choosing circuit being configured to select the amplifier gain depending upon the chosen resistor.

20. The reading circuit according to claim 13, wherein:
the zone identifying circuit includes a zone reference voltage generating circuit configured to generate a plurality of zone reference voltages which corresponds to a plurality of interfaces between the plural level zones, the zone identifying circuit including a plurality of comparators configured to compare the analog output signal with each of the plural zone reference voltages, the zone identifying circuit including an encoder configured to produce from a compared result of the plural comparators a code which indicates the relevant level zone,
the shift voltage generating circuit includes a reference shift voltage generating circuit configured to generate a plurality of reference shift voltages which corresponds to the plural level zones, the shift voltage generating circuit including a shift choosing circuit configured to choose a relevant reference shift voltage from the plural reference shift voltages on the basis of the code produced by the encoder so as to output the chosen reference shift voltage as the shift voltage,
the operational amplifier circuit is a variable operational amplifier circuit configured to change an amplifier gain,
the zone reference voltage generating circuit is configured to change the plural generated zone reference voltages,
the reference shift voltage generating circuit is configured to change the plural generated reference shift voltages, and
the operational amplifier circuit changes the amplifier gain depending upon the changed plural generated zone reference voltages and the changed plural reference shift voltages.

* * * * *